(12) United States Patent
Lehman, Jr. et al.

(10) Patent No.: US 9,646,903 B2
(45) Date of Patent: May 9, 2017

(54) THERMOSET POLYMIDES FOR MICROELECTRONIC APPLICATIONS

(71) Applicants: James C. Matayabas, Jr., Chandler, AZ (US); Saikumar Jayaraman, Chandler, AZ (US)

(72) Inventors: Stephen E. Lehman, Jr., Chandler, AZ (US); James C. Matayabas, Jr., Chandler, AZ (US); Saikumar Jayaraman, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/171,707

(22) Filed: Feb. 3, 2014

(65) Prior Publication Data

US 2014/0148557 A1    May 29, 2014

Related U.S. Application Data

(62) Division of application No. 12/361,485, filed on Jan. 28, 2009, now Pat. No. 8,643,199, which is a division of application No. 11/432,986, filed on May 12, 2006, now Pat. No. 7,534,649.

(51) Int. Cl.

| | | |
|---|---|---|
| *C08G 73/10* | (2006.01) | |
| *C08L 79/08* | (2006.01) | |
| *H01L 23/24* | (2006.01) | |
| *H01L 21/56* | (2006.01) | |
| *H01L 23/00* | (2006.01) | |

(52) U.S. Cl.
CPC ............ *H01L 23/24* (2013.01); *H01L 21/563* (2013.01); *H01L 24/29* (2013.01); *C08G 73/10* (2013.01); *C08L 79/08* (2013.01); *C08L 2203/20* (2013.01); *C08L 2205/02* (2013.01); *H01L 21/566* (2013.01); *H01L 2224/16225* (2013.01); *H01L 2224/32225* (2013.01); *H01L 2224/73203* (2013.01); *H01L 2224/73204* (2013.01); *H01L 2224/73253* (2013.01); *H01L 2924/01029* (2013.01); *H01L 2924/01078* (2013.01); *H01L 2924/10253* (2013.01); *H01L 2924/14* (2013.01); *H01L 2924/181* (2013.01)

(58) Field of Classification Search
CPC ...... C08G 73/10; C08G 73/12; C08G 73/121; C08G 73/122; C08G 73/123; C08G 73/124; C08G 73/125; C08G 73/128
See application file for complete search history.

(56) References Cited

U.S. PATENT DOCUMENTS

| | | |
|---|---|---|
| 5,286,439 A | 2/1994 | Shinohara |
| 6,326,237 B1 | 12/2001 | Carter et al. |
| 6,597,575 B1 | 7/2003 | Matayabas et al. |
| 6,653,433 B2 * | 11/2003 | Edman .................... B32B 15/08 |
| | | 428/411.1 |
| 6,841,867 B2 | 1/2005 | Matayabas et al. |
| 6,911,726 B2 | 6/2005 | Rumer et al. |
| 6,974,723 B2 | 12/2005 | Matayabas et al. |
| 6,974,728 B2 | 12/2005 | Matayabas |
| 7,030,483 B2 | 4/2006 | Matayabas et al. |
| 7,084,492 B2 | 8/2006 | Jayaraman |
| 2003/0077478 A1 | 4/2003 | Dani et al. |
| 2003/0168731 A1 | 9/2003 | Matayabas et al. |
| 2005/0041406 A1 | 2/2005 | Matayabas et al. |
| 2005/0214977 A1 | 9/2005 | Rumer et al. |
| 2005/0260790 A1 | 11/2005 | Goodner et al. |
| 2006/0001158 A1 | 1/2006 | Matayabas et al. |
| 2006/0043614 A1 | 3/2006 | Jayaraman |
| 2006/0060956 A1 * | 3/2006 | Tanikella ..................... 257/686 |
| 2006/0073344 A1 | 4/2006 | Jayaraman |
| 2006/0106174 A1 | 5/2006 | Ohkita et al. |
| 2006/0183314 A1 | 8/2006 | Dellaguardia et al. |

\* cited by examiner

*Primary Examiner* — Ana Woodward
(74) *Attorney, Agent, or Firm* — Blakely, Sokoloff, Taylor & Zafman LLP

(57) ABSTRACT

Dendrimer/hyperbranched materials are combined with polyimide to form a low CTE material for use as a dielectric substrate layer or an underfill. In the alternative, ruthenium carbene complexes are used to catalyze ROMP cross-linking reactions in polyimides to produce a class of cross-linkable, thermal and mechanical stable material for use as a dielectric substrate or underfill. In another alternative, dendrimers/hyperbranched materials are synthesized by different methods to produce low viscosity, high Tg, fast curing, mechanically and chemically stable materials for imprinting applications.

7 Claims, 11 Drawing Sheets

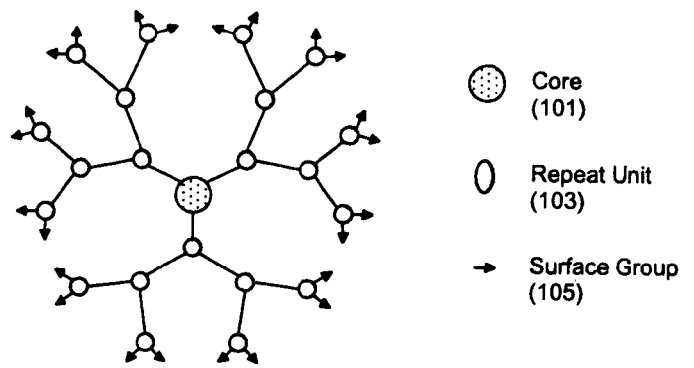
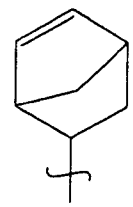
Figure 3A
Figure 3B
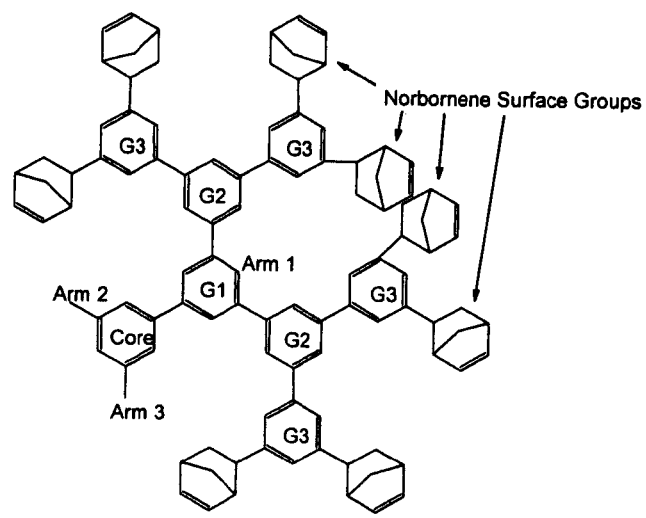
Figure 3C

Hyperbranched Polymer

Heat,
Melt Polymerization

Hyperbranched PolyEsters

K2Co3, Heat, Toluene
and DMAC

Hyperbranched PolyQuinolones

THERMOSET POLYMIDES FOR MICROELECTRONIC APPLICATIONS

This is a Divisional Application of application Ser. No. 12/361,485 filed Jan. 28, 2009 which is presently pending which is a Divisional Application of Ser. No. 11/432,986 filed May 12, 2006 now U.S. Pat. No. 7,534,649, issued May 19, 2009.

BACKGROUND

1). Field

Embodiments relate generally to a method of making materials for dielectric substrate layers and underfills, and more specifically in the substrate imprinting process.

2). Discussion of Related Art

Substrate imprinting technology is a process for packaging substrate fabrication. A substrate includes non-conductive material which a circuitry pattern is printed. A circuitry pattern is directly printed into the dielectric layer by imprinting a build-up layer. The current state of the art for substrate manufacture utilizes a thermosetting epoxy dielectric film upon which a layer of copper is plated. The circuitry is obtained by use of a sacrificial photo-definable layer, which after being developed serves as the mask for etching the exposed copper and dielectric material. The photo-definable layer is then removed and the dielectric layer is cured to form a rigid pattern.

In the current state of the art, chips are electrically connected "face-down" with its electronic components in direct contact with the conductive bumps on the chip-bond pads on the substrates or circuit boards. Using the entire area of the die, this direct connection between chip and substrate provides a flexible and mechanically rugged interconnection method. An underfill is a dielectric adhesive material to enhance the performance of a chip by interposing between a chip and a substrate. An underfill layer serves several purposes. The underfill provides mechanical strength to the assembly and protects the bumps from moisture or other environmental hazards. It reduces joint stress and improves reliability of the structure, allowing low cost substrates to be used. Most importantly, it compensates for any thermal expansion difference between the chip and the substrate. The underfill mechanically "locks together" chip and substrate so that differences in thermal expansion do not break or damage the electrical connection of the bumps.

The substrate and underfill are insulators and critical in the process of electronic packaging. A low thermal expansion coefficient (CTE) in the underfill prevents a thermo-mechanical mismatch between the die and the substrate. In particular, a low thermal expansion coefficient of expansion in the underfill prevents interference with the soldering joint CTE (e.g. about 25 ppm/° C.). An underfill with a high CTE (e.g. 70-85 ppm/° C.) may cause cracking and delamination of the structure during operation. A material with high-temperature stability and superior thermal conductivity helps to maintain integrity in electronic packaging by remaining stable while dissipating heat faster.

Such rigorous demands on materials have prompted discovery and development of alternatives to epoxy-based materials. Specifically, the development of packaging materials with improved toughness and stress management for improved reliability, reduced dielectric constant for miniaturization and higher process frequencies, and rapid curing for increased production (units per hour/UPH) and reduced cost. For new materials to be attractive, they must be compatible with existing processes and equipment and must be available at low cost.

There is growing interest in thermosetting polyimide materials for use in packaging applications. However, there remains a need to reduce the CTE of the thermoset polyimide resin to match the low CTE of the silicon die to be used as an underfill. One method to reduce CTE is addition of filler materials, but filler particles lead to higher viscosity, decreased strain to failure and have the potential for excursions due to large filler particles and filler settling.

Another known shortcoming of polyimide materials is the incompatible thermoplastic and thermosetting properties with existing processes and equipment. Thermoplastic polyimides require injection molding/curing at high temperatures and pressures, typically above 400° C. Current polyimide cross-linking technology is based on thermally induced reaction of unsaturated groups such as ethynyl and phenyl leading to a complex crosslinked product. For example, although nadimide resins, developed by NASA and others for aerospace and electronics applications, have good mechanical properties, the curing onset temperature is at least 200° C., making it out of range of the current processes used in the manufacturing of most microelectronic devices. Thus, there is a technology gap that prevents widespread use of cross-linking polyimides in microelectronics applications, namely processability and high curing temperatures.

BRIEF DESCRIPTION OF THE DRAWINGS

Embodiments are described by way of examples with reference to the accompanying drawings, wherein:

FIG. 3A illustrates a generic structure of a dendrimer;

FIG. 3B illustrates a strained cyclic olefin used to decorate the surface of a dendrimer;

FIG. 3C illustrates a base dendrimer or hyperbranched polymer with the core and repeat units;

FIG. 4D illustrates a low molecular weight norbornene-containing resin undergoing condensation reaction to produce an intermediate product; FIG. 4E illustrates an intermediate product nadimide-terminated imide oligomer entering ROMP using RCC to produce the final product thermoset polymer; and FIG. 4F illustrates the final product, a norbornene-functionalized polyphenylene dendrimer;

DETAILED DESCRIPTION

The current state of the art for packaging materials is epoxy formulations comprising silica fillers for reduced thermal expansion coefficient (CTE). A wide variety of resins, cross-linkers, and catalysts are used, depending upon the processes used. For example, liquid epoxy resins are used for underfills while die attach pastes and solid epoxy resins are used for mold compounds and substrate dielectrics. Die attach films currently comprise both liquid epoxy resins for curing and thermoplastic polyimides for film formation and improved properties. However, high temperatures required for processing prevents polyimides from being used extensively.

Imprinting process is a foundation for the move from microelectronic to nanoelectronic age. Imprinting process is not only capable of imprinting <10 micron lines traces, it has the potential of improving substrates without impacting costs. In essence, imprinting process provides an attractive alternative in obtaining a fast, reliable and cost-effective substrates with finer feature sizes. Imprinting pattern for printed wiring board (PWB) microvias and sequential build-up provides an advantage to traditional photoimage lithography. Imprint patterning requires no photosensitive materials in production. The pattern is produced directly into the face of the permanent substrate, as oppose to developing a temporary resist in photolithography. Imprint processing also skips a number of traditional processes as required in the photolithography.

The underpinning of imprinting is pressure-forming, as employed in molding and lamination. First, an imprinter mask is made with the desired features raised from the metal surface. Next, the imprinter is coated with a thin layer of mold release compound to protect it and prevent sticking during the imprinting process. The substrate to be patterned is then coated with a film of polymer. The polymer is heated above its glass transition temperature (Tg) where it becomes viscoelastic. The imprinter is then pressed into the polymer and the system is cooled back down below the polymer's Tg, thereby freezing the pattern into the polymer. The collective layers of polymers form the dielectric substrate layers. The mask is then removed and the trenches are cleaned with either $O_2$ plasma or with solvents to remove any residual polymer that may remain in the trenches. The imprinter is reusable, thus providing cost effective lithography.

FIGS. 1A to 1H illustrate one of multiple cycles in the manufacture of an electronics substrate of the kind to which a microelectronic die can be mounted. A material on the substrate is imprinted (FIG. 1C), and the material is then at least partially cured (FIG. 1D) while still in contact with a die, so that the shape and profile of the material can be maintained. The thermoset polyimide material disclosed in this specification can be used as the material to form the substrate.

Figure 1A:
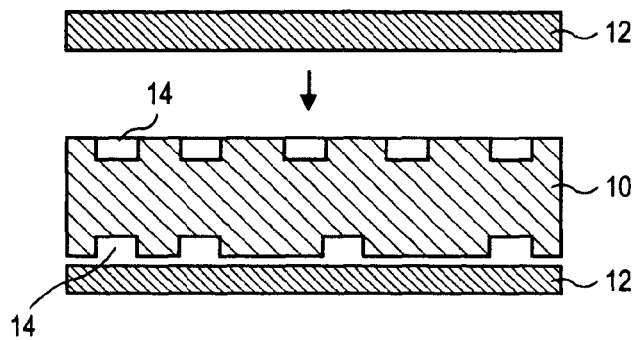
FIG. 1A is a cross-sectional side view illustrating a base component and two layers of moldable material that are placed on the based component.

FIG. 1A illustrates a base component 10 and layers of soft, moldable material 12. The base component 10 has a plurality of trenches 14 formed therein. The material 12 is located on upper and lower surfaces of the base component 10 and over the trenches 14.

Figure 1B:
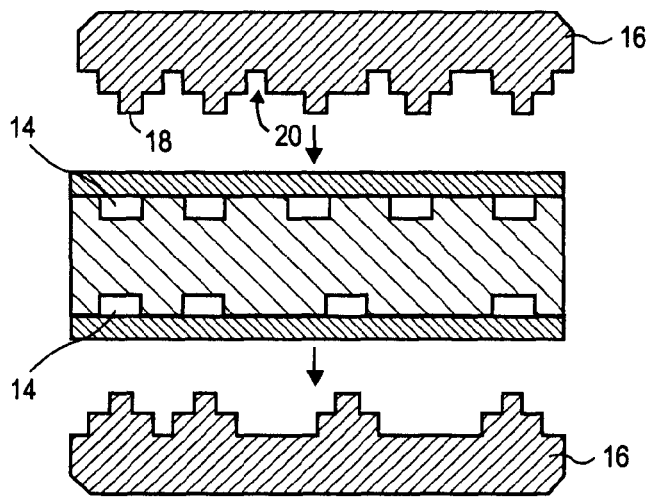
FIG. 1B is a view similar to FIG. 1A, further illustrating two dies having profiles for imprinting into the material.

FIG. 1B illustrates the components of FIG. 1A after the material 12 is placed on the base component 10, and further illustrates imprinting dies 16. Each die 16 has a profile with a plurality of raised and recessed formations 18 and 40, respectively.

Figure 1C:
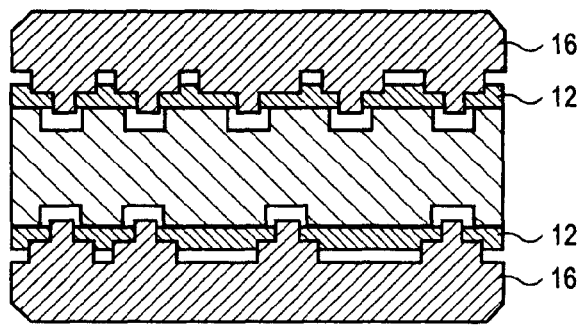
FIG. 1C is a view similar to FIG. 1B, after imprinting of the material with the dies.

As illustrated in FIG. 1C, the dies 16 are moved into contact with the material 12, and a force is applied that imprints the profile of the dies 16 into the material 12. Outer surfaces of the material 12 then acquire a shape that corresponds to the profile of the respective die 16. The trenches 14 allow for raised formations 18 of the die 16 to penetrate almost entirely through the material 12. The material 12 is, at this stage, suitably soft to allow for imprinting of a shape therein.

Figure 1D:
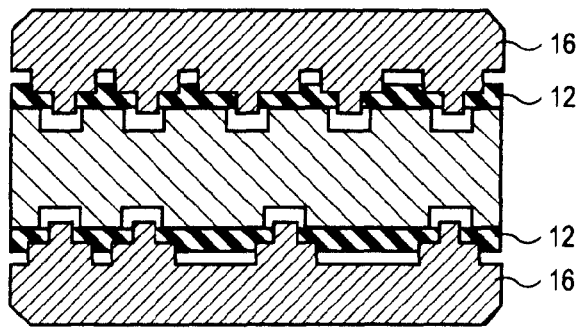
FIG. 1D is a view similar to FIG. 1C, after the material is hardened while still in contact with the dies.

As illustrated in FIG. 1D, the material 12 is subsequently modified while being held in the profile of the respective die 16. By modifying the material 12, at least partial curing of the material 12 is accomplished due to a change in composition of the material 12 from a first composition to a second composition. Numerous mechanisms can be employed to harden the material 12, as will be discussed herein.

Figure 1E:
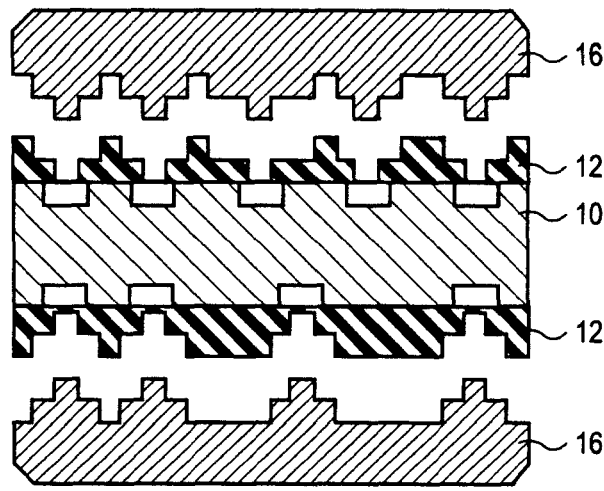
FIG. 1E is a view similar to FIG. 1D, after the dies are removed.
Figure 1F:
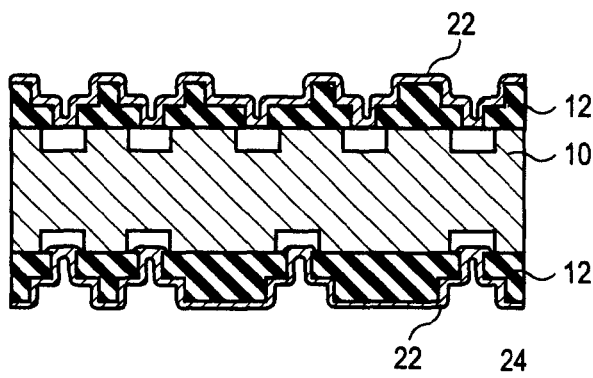
FIG. 1F is a view similar to FIG. 1E, after a thin metal layer is formed on the hardened material.
Figure 1G:
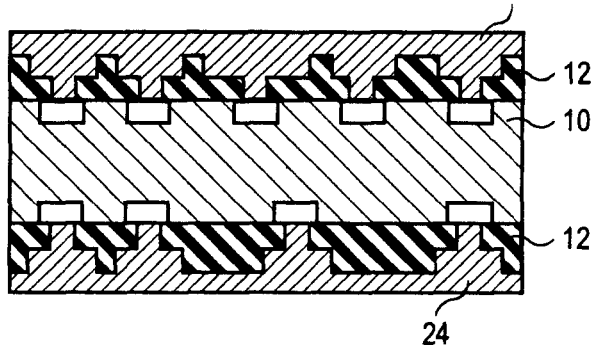
FIG. 1G is a view similar to FIG. 1F, after a thick metal layer is plated on the thin metal layer.

As illustrated in FIG. 1E, the dies 16 are subsequently removed from the hardened material 12. FIG. 1F illustrates the structure of FIG. 1E, after a thin metal layer 22 is sputtered or otherwise deposited over the hardened material 12. As illustrated in FIG. 1G, a thick metal layer 24 is subsequently plated or otherwise deposited on the thin metal layer 22. As further illustrated in FIG. 1H, the thick metal layer 24 is subsequently planarized to leave metal conductors 26, only within trenches defined in the hardened material 12.

Figure 1H:
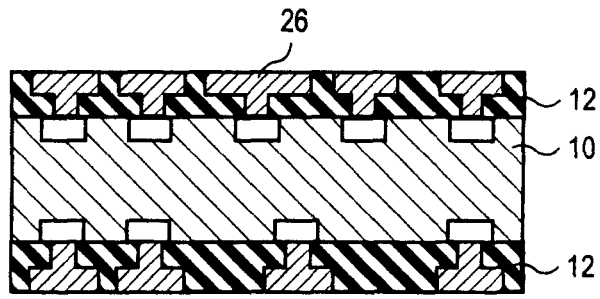
FIG. 1H is a view similar to FIG. 1G, after the thick metal layer is planarized.

The process of FIGS. 1A to 1H may then be repeated, with the structure of FIG. 1H acting as the base component. When the same material is used in a subsequent cycle relative to the previous cycle, the curing temperature profile would be the same in both layers, whereas, when a different material relative to the previous cycle is used in a subsequent cycle, there will be a different curing temperature profile in the different layers.

Figure 2:
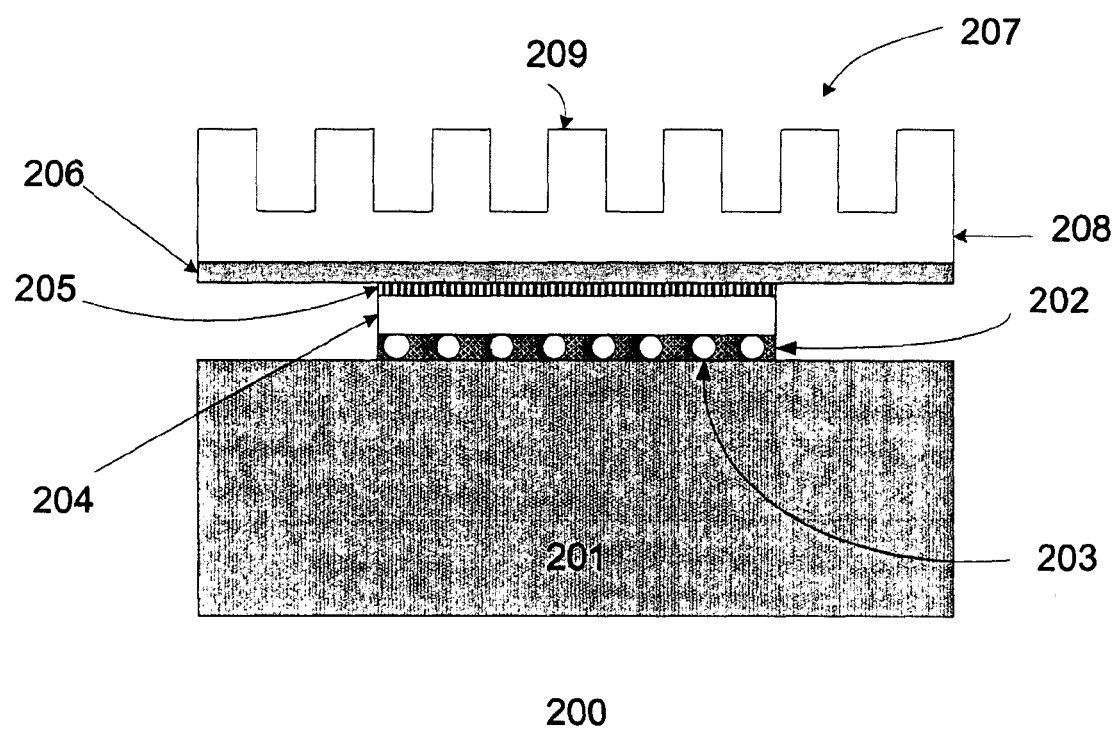
FIG. 2 illustrates a cross-sectional view of a semi-conductor package.

FIG. 2 illustrates a cross-sectional view of a semi-conductor package 200 which uses an embodiment of the invention. The semi-conductor package 200 includes a substrate 201, having a semiconductor device 104 mounted on a top surface of the substrate 201. The semiconductor device is a microelectronic die having an integrated circuit formed therein. In one embodiment, the substrate 201 is a printed circuit board. In another embodiment, the substrate 201 may be a different material such as silicon or ceramic. The semiconductor device 204 is mechanically and electrically coupled to the top surface of the substrate 201 via a plurality of solder bump connections 203. In some embodiments, the gap may be filled with an underfill material 202 using any of the thermoset polyimide materials as disclosed in this specification. The substrate 201 contains at least one wiring layer (not shown) that electrically connects the device to pins or balls located along the bottom surface of the substrate. The solder balls 203 are placed in an array and are commonly referred to as a ball grid array. Since the semiconductor device 204 is flipped into place so that the solder balls 202 is electrically and mechanically connected to the pads or lands in the substrate 201, the semiconductor device 204 is sometimes called a flip chip. A compliant heat transfer medium 205 known as a thermal interface material. This nanocomposite phase change material fills small voids in the major surface of the backside of the semiconductor device and the corresponding surface of the heat spreader 106 to which the semiconductor device 204 is attached. A heat sink 207 is attached to the heat spreader 206. The heat sink further includes a plurality of fins 209 extending from the second thermal plate 208.

Combining Dendrimers or Hyperbranched Polymers to Thermoset Polyimides

The use of dendrimers or hyperbranched polymers to reduce CTE of packaging materials has many advantages over the use of silica fillers. Dendrimers can make a homogeneous mixture with the bulk resin, providing little viscosity increase compared to the large increase in viscosity with the use of particulate fillers like silica. Dendrimers and hyperbranched particles also phase separate after curing and provide a microstructure similar to that of traditional filled system without the issue of filler settling. Also, dendrimers and hyperbranched polymers do not suffer from alpha particle emission and wire short which are problems with silica fillers. Collectively, these advantages contribute to the properties desirable for combining dendrimers or hyperbranched polymers with thermosetting polyimides as a dielectric substrate layer or an underfill.

The molecular shape of dendrimers and hyperbranched polymers varies from spherical to globular to extended geometries. The higher molecular density of dendrimers and hyperbranched polymers is due to the small hydrodynamic volume of dendrimers and hyperbranched polymers compared to linear polymers. This densely packed material is expected to have a lower CTE than linear polymer due to the thermal expansion of chemical bonds being restricted spatially by the unique molecular architecture of dendrimers.

FIGS. 3A to 3C describe the structures of novel dendrimers or hyperbranched polymers which are used to combine with novel thermosetting polyimide to give low-CTE cured material without the use of filler. By way of illustration, these are merely examples of one of many dendrimers and hyperbranched polymers that can act as a component in formulations with thermosetting polyimides for packaging applications. The cured product will result in a lower CTE rather than as the sole material alone.

FIG. 3A illustrates a generic structure of a dendrimer. The dendrimer generally comprise of a core 301 which is connected to multiple repeat units 303 and the peripheral repeat units are connected to surface groups 305. An example of such surface group is illustrated in FIG. 3B. FIG. 3B illustrates an example of a strained cyclic olefin used to decorate the surface of a dendrimer. FIG. 3C shows a base dendrimer or hyperbranched polymer with the core and repeat units of FIGS. 3A and 3B. This base dendrimer or hyperbranched polymer can assume a wide variety of chemical structures. The most useful base structures are those that give a low CTE, such as polyphenylenes and other highly aromatic structures including aromatic polyamides and polyesters.

Formulations employing the dendrimers and hyperbranched polymers in use with thermosetting polyimides would be cross-linked by ring opening metathesis polymerization (ROMP), a transition-metal catalyzed process. Upon curing, the dendrimers and hyperbranched polymers will phase separate from the bulk material. The formation of covalent bonds between the dendrimer or hyperbranched polymer phase provides a strong interface and prevents phase separation until after curing, this eliminates the problem of filler settling often seen with silica fillers.

To make a useful formulation, these dendrimers or hyperbranched polymers may be mixed with any resin that cross-links by olefin metathesis polymerization as the bulk matrix. Examples include dicyclopentadiene, norborene, and nadimide endcapped resins. Furthermore, by way of illustration and not by limitation, the dendrimer or hyperbranched polymer can at least be one of many different preparations. For instance, a preparation of hyperbranched polyphenylene (with norborene surface groups) with methyol endgroups; this hyperbranched polyol can then be esterified with 5-carboxynorbornene under standard conditions. Another example is preparation of hyperbranched aromatic polyamide with norbornene amine surface groups. Further example is the preparation of a mold compound where the hyperbranched polyphenylene with norbornene surface groups (1 part), nadimide-terminated imide oligomer (1 part), and an appropriate catalyst (50 ppm) are mixed together with an overhead stirrer and passed several times through a two roll mill. The resulting mixture is then transferred to a part by resin transfer molding or similar technique and cured at elevated temperature.

In application, the mixture of dendrimer or hyperbranched polymer and matrix resin is mixed with an olefin metathesis catalyst, fillers, filler modifiers, stress modifiers, flame retardant agents, mold release agents, or other additives to form a processable mixture. This mixture may then be applied to parts by jet dispensing, screen printing, resin transfer molding, reaction injection molding, application of a film, or casting. The material would be cured by heating the part to a given temperature for a given time. Typically, these materials will be rapidly cured (in matter of minutes) at low temperatures of less than 150° C.

Using Ruthenium Carbene Complexes to Catalyze ROMP Cross-Linking Reactions

The next embodiment involves using ruthenium carbene complexes (RCC) as a catalyst for polyimides to undergo ring opening metathesis polymerization (ROMP) cross-linking reaction. ROMP of polyimides using RCC provides liquid and solid polyimide resins that can be processed and cured using current equipment and processes. The cured materials are expected to have significantly improved properties that enable improved reliability and higher frequencies.

The polyimides undergoing reaction are accessible synthetically. By way of illustration and not by limitation, one example is the use of linear polyimides. Linear polyimides used in the reaction could be prepared by condensation of diamines with anhydrides. The cross-linking reaction, ROMP, for example, operates on nadimide compounds where simple mononadimide compounds produces polymers. This shows that it will polymerize bis-nadimide compounds leading to cross-linked polymeric structures.

The synthesis of RCC is known in the literature. RCC is the most appropriate catalyst system for use in current processes for microelectronics fabrication because it possesses greater stability to the temperature, the moisture, and the atmospheric oxygen that the product materials are exposed to prior to cure compared to ill-defined or early transition metal catalysts. Furthermore, recent advances in RCC provide sufficient stability, particular ones that are temperature labile. Temperature labile RCCs will initiate polymerization at elevated temperatures of about 80° C. to about 160° C., but not at ambient storage or use conditions. This aspect of RCC enables the use of this cross-linking reaction for nadimide-based polyimides.

ROMP reactions of polyimides using RCC produces cross-linked polyimides. Cross-linked polyimides are high-performance polymeric materials used in microelectronics, aerospace and other applications. Cross-linking provides materials of better resilience compared to linear polymers because of the extensive covalent connections between polymer chains. For example, composite materials of carbon fiber and cross-linking polyimide matrix resins have been used to fabricate parts for space vehicles and airplanes. ROMP has been used commercially for reaction injection molding of cyclic-olefin monomers to produce poly-dicyclopentadiene based cross-linked materials that are tough and durable. Furthermore, these materials have been known to make body armor and other sports equipment; they have even been evaluated for electronics (e.g., a 131 mm thick sample of poly-dicyclopentadient has a dielectric constant of only 2.49 at 1 MHz and a dielectric strength of 400V/mil. Source: Materia., Inc.). Therefore, based on known characteristics of ROMP products, the combination of ROMP and polyimide materials will provide a new class of cross-linkable polyimides that are useful in electronics packaging applications for forming dielectric substrates layers or underfills in substrate imprinting processes.

FIGS. 4A to 4F illustrate various examples of monomers that are used to combine with ROMP to produce cross-linkable polyimides in electronics packaging applications. In a group of examples, monomers are comprised of two or more norbornene rings connected with rigid aromatic moieties such as phenyl, aromatic esters, amides, imides, ethers and polycyclic aromatic hydrocarbons. In another example, low molecular weight norbornene-containing resins are prepared by condensation of a difunctional norbornene and a difunctional aromatic component with appropriate endcappers to form a low molecular weight resin with multiple polymerizable units.

Figure 4A:
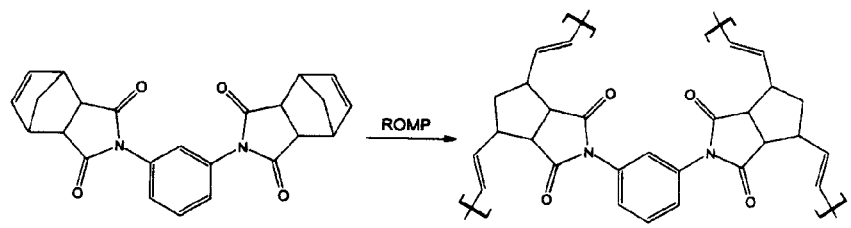
FIGS. 4A and 4B illustrate two different examples of a bisnadimide monomer undergoing ROMP using RCC producing a thermoset polymer.
Figure 4B:
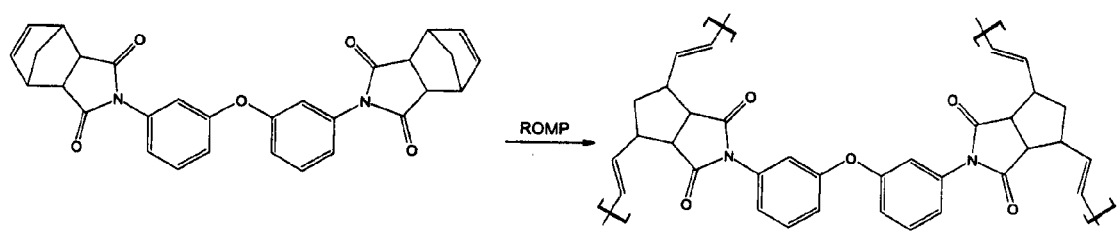
Figure 4C:
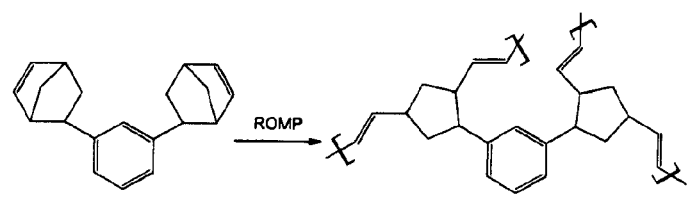
FIG. 4C illustrates a monomer undergoing ROMP using RCC producing a thermoset polymer.

FIGS. 4A to 4B illustrate examples of polymerization of nadimide monomers to form cross-linked polyimides. Specifically, FIGS. 4A to 4B show two examples of cross-linked polyimides formed from the various bis-norbornene monomers using RCC. ROMP polymerization of various bis-norbornene monomers to give cross-linked polyimides. In particular FIGS. 4A and 4B show two different examples of bisnadimide monomer undergoing ROMP using RCC producing a thermoset polymer. FIG. 4C shows a monomer undergoing ROMP using RCC producing a thermoset polymer.

Figure 4D:
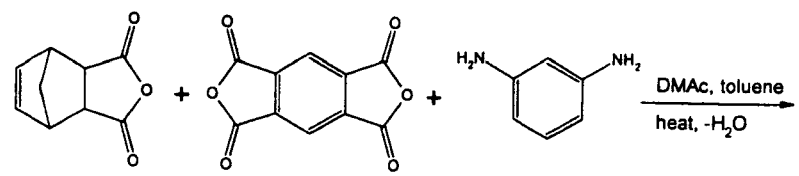
FIG. 4D to 4F illustrates a low molecular weight norbornene-containing resin undergoing reactions to form a norbornene-functionalized polyphenylene dendrimer.
Figure 4E:
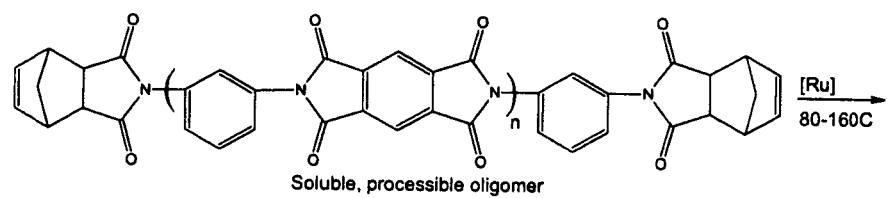
Figure 4F:
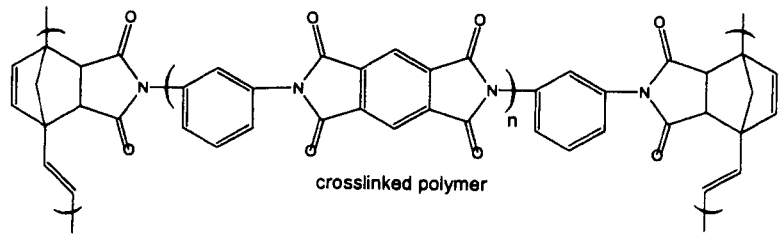

FIGS. 4D to 4F illustrates the sequence of reactions in the synthesis of a ROMP cross-linkable nadimide-containing imide oligomers. In particular FIG. 4D shows the low molecular weight norbornene-containing resin undergoing condensation reaction to produce an intermediate product in FIG. 4E. FIG. 4E shows the intermediate product entering ROMP using RCC. FIG. 4F shows the final product, an example of the cross-linked nadimide-containing imide oligomer.

Three specific examples will now be described. First is an example of the polymerization of monomers to form cross-linked polymers, specifically, the preparation of 4-[3-(3,5-dioxo-4-azatricyclo[5.2.1.0$^{2,6}$]dec-8-en-4-yl)phenyl]-4-azatricyclo[5.2.1.0$^{2,6}$]dec-8-ene-3,5-dione. 1,3-diaminobenzene and two equivalents of 4-azatricyclo [5.2.1.0$^{2,6}$]dec-8-ene-3,5-dione (nadimide) are combined with toluene (20 wt % solids) in a three-neck round-bottom flask equipped with a Dean-Stark trap and condenser. The mixture is stirred with heating to reflux. Water is removed from the reaction as the azeotrope reacts with toluene and condenses in the Dean Stark trap. Solvent is removed to afford the product, which may be purified by recrystallization.

A second example is the preparation of imide oligomer with norbornenyl units at chain ends and in main chain. Nadimide, p-diaminobenzene, and pyromelletic dianhydride are combined in a 2:2:3 molar ratio in dimethylacetamide (DMAC) and stirred for several hours at 120° C. Toluene is then added and the mixture is refluxed for azeotropic removal of water. The remaining toluene is then removed by distillation and the mixture is precipitated into a blender containing an excess of deionized water and then dried in vacuo.

A third example is the preparation of a molding compound. The imide oliogomer (1 pt), dicyclopentadiene (1 pt), silica filler (2 pt), norbornen-5-yltriethoxysilane (0.01 pt), and an appropriate catalyst (100 ppm) are mixed together and passed through a two roll mill. The resulting mixture is then transferred to a part by resin transfer molding or similar technique and cured at elevated temperature.

The thermal and mechanical properties including CTE of the cross-linked polyimide can be controlled by altering the molecular weight of the resins. For example, by way of illustration and not limitation, the amounts of components such as endcapper, diamine, and dianhydride as used in the polyimide oligomer illustrated in FIGS. 4D to 4F, can be altered to customize the molecular weight of the product. Lower molecular weight oligomers have lower viscosities during processing and higher final cross-link densities, while higher molecular weight oligomers have higher viscosities during processing but the final cured produce would be very tough with high flexural and tensile strengths and $K_{1C}$. Furthermore, chemical structure of the oligomers can be tailored by altering the structure of the components, which would modulate the thermal and mechanical properties and the dielectric constant of the cross-linked polymer. Structural flexibility also gives the possibility of creating oligomers with crystal phases. For instance, as oppose to what's shown in FIGS. 4D to 4F where norbornene units are illustrated as endgroups, norbornene units could also be incorporated as pendant groups.

In typical applications, mixtures of monomers and resins, solvents, stress modifiers, filler modifiers, filler and various other components would be combined to provide processable materials that give the desired properties in the final cured product. Specifically, the resins described above are likely to be solids at room temperature and could be mixed with either a solvent or a reactive diluent such as dicyclopentadiene or some derivative thereof to give a mixture that has properties amendable to the process used to apply the material. If mixed with a reactive diluent, the properties of the cured material would be modified. In particular, lower CTE is expected from the higher cross-link density provided by incorporation of dicyclopentadiene or related monomers. Cyclic olefin molecules appended with a trialkoxysilane moiety could be added and would incorporate the filler into the cross-linked polymer via covalent chemical bonds. This is analogous to the epoxide-containing trialkoxysilanes used in the current epoxy technology to improve the performance of filler by altering the filler-bulk polymer interface. Flame resistance or retardance could be provided by halogenated or phosphate ester containing diamines or dianhydrides. This is yet another added benefit particularly appropriate for materials used to form substrate dielectric and underfill which can experience high heat.

A critical component of this embodiment is the use of a latent catalyst for which the initiation of cure can be controlled by temperature. Controlling the cure temperature is important when formulating materials amenable to application by jet dispensing, screen printing, casting, or laminating. Some examples of such latent catalysts are N-heterocyclic carbene complexes of ruthenium known in the art. These catalysts are stable to air and moisture and will not initiate polymerization or cure until a certain temperature is reached. The temperature of initiation is in turn modulated by the structure of the carbene ligand and other ligands. For instance amore sterically bulky carbene ligand will increase the temperature of polymerization initiation while a more labile phosphine ligand will decrease the temperature of polymerization initiation. The general category of cross-linkable polyimide materials described in this embodiment can also be preformed by resin transfer molding or reaction injection molding, which are currently used for dicyclopentadiene (DCPD) and polyimides in other contexts.

Using Hyperbranched/Dendritic Materials in Imprinting Process

The use of dendritic/hyperbranched materials can be used to solve several problems associated with nanoimprint lithography. Current nanoimprint lithography production is limited to performing one level of processing while maintaining the same resolution demonstrated in the polymer imprinting layer so fine metal line structures can be formed and also connected to the next layer via use of via's. The second and upper layer often has to be processed with great care so that the processing temperature or the material flow properties do not erase or deform the imprinted layer below. Dendritic/hyperbranched materials can be modified to have different Tg, for instance a high Tg for the bottom layer and a low Tg for the top layer, therefore processing temperatures of the different layers can be different (where top is about 50° C. lower than bottom) so that forming an upper layer will not deform the bottom imprinted layer.

Second, nonvertical walls lead to tearing and detachment of the metal film during liftoff of the mask. This can occur in imprint lithography if the imprinting element does not have vertical sidewalls or if the nonvertical sidewalls in the substrate result from descumming in removing residual polymer from the bottom of the imprinted feature. Dendritic/hyperbranched materials can be formed with a high Tg that has low viscosity in the melt during impriting process yet undergo high cross-link density during curing without loss of mechanical properties such that the material cures rapidly to maintain good feature registration during impriting and finally undergoes little shrinkage during processing. Furthermore, dendritic/hyperbranched materials can be formed to have low dielectric constant and loss, good thermal stability, a low CTE (<50 ppm) below Tg and good adhesion to various substrates metal (especially copper (Cu)).

Dendritic/hyperbranched materials are synthesized by the polymerization of A2B and AB2 monomers. High molecular weight polymer systems that are highly branched can be synthesized and the polymer can be selectively synthesized with high functionality at chain ends. Presence of high molecular weight provides mechanical robustness to maintain features of the imprint. Further, polymers that are highly branched have low viscosity at high temperature, making them excellent candidates for imprinting. The hyperbranched materials when formulated with reactive diluents such as epoxy, cyanate esters etc. can be cured during and after the imprinting process. When cured, these structures form a hybrid material. The hybrid material has many advantages and benefits in electronic packaging applications for use as a dielectric substrate layer or an underfill. For example, the spherical nature of the hybrid material contributes to a low viscosity (as compared to linear or cross-linked materials) during processing, low shrinkage, and high functionality for adhesion. The hybrid material has a low volatility from the hardeners, resulting in lower voids, and lower stress in the films because of low shrinkage. The hybrid materials are also expected to have very high Tg (greater than 125° C.) and high thermal stability, thus being compatible to 460° C.

Figure 5A:
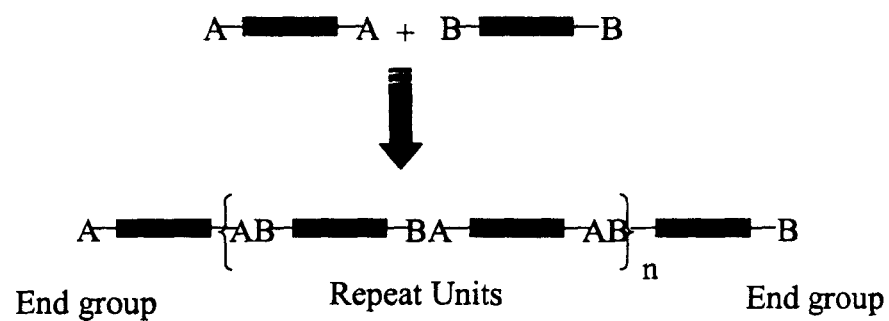
FIG. 5A illustrates a generic linear polymer.
Figure 5B:
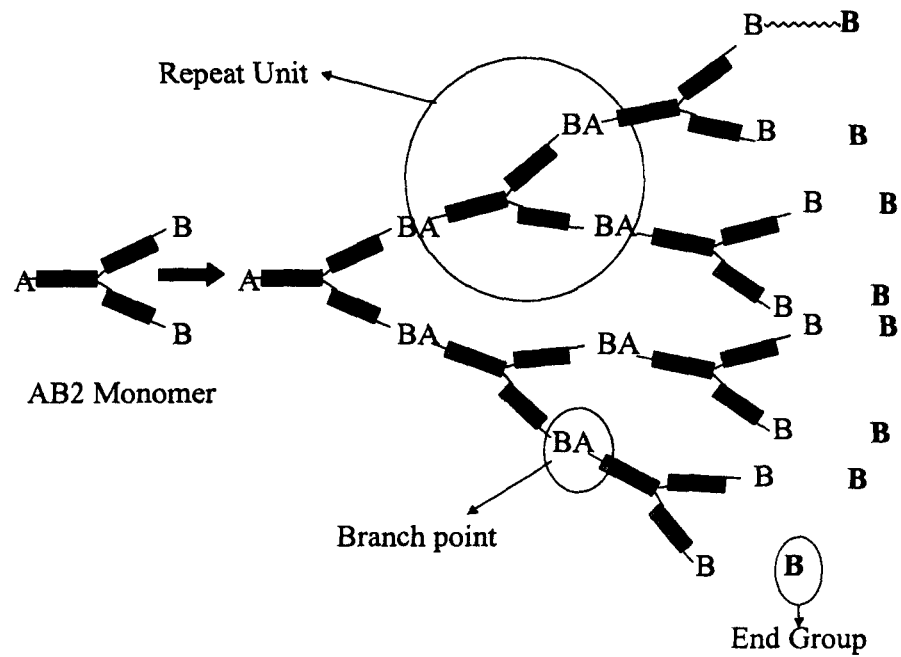
FIG. 5B illustrates a generic dendrimer/oligomer.

FIGS. 5A to 5B illustrate the differences between linear polymers and dendrimer/oligomers. FIG. 5A illustrates a linear polymer. The linear polymer is polymerized from monomers 501. The linear polymer 502 has two end groups and repeat units in the middle. Linear polymers are generally defined by the number of repeat units (n). The number of repeat units (n) defines the molecular weight of the polymer. While the number of repeat units (n) also controls the mechanical properties, the solubility and the polarity, the reactivity (especially cross-linking) is controlled by the end groups.

FIG. 5B illustrates a dendrimer/oligomer. The dendrimer/oligomer is polymerized from an AB2 monomer. The dendrimer has multiple repeat units and multiple branch points in the middle while having multiple end groups. Compared to linear polymers and oligomers, dendrimers are approximately spherical in shape and have large number of end groups and are densely packed as illustrated in FIGS. 5A and 5B. Dendrimers' spherical structure contributes to a lower Rg (Radius of gyration) compared to linear polymer. Thus, for a same number of repeat units (n) as the linear polymer, the dendritic/hyperbranched material has a lower viscosity compared to the linear form of the polymer. Also, in a dendrimer, there is less entanglement for the same number of repeat units (n) so the dendrimer results in less shrinkage, thus leading to higher Tg materials. End groups of dendrimers are in close proximity, allowing faster reactions, cross-linking or adhesion, and also contributes to the solubility properties of the polymer.

Hyperbranched materials are in the same class, but a variation of dendrimers. Hyperbranched materials tend to be less regular and more amendable for industrial scale up. The advantages of dendrimers/hyperbranched materials over linear polymers for electronic packaging applications can be described in the summary table below:

| Hyperbranched Material Features | Properties During Processing | Properties Post Processing | (Comparison to) Linear polymers or thermoset |
|---|---|---|---|
| Spherical Shape | Low viscosity | Low shrinkage | High viscosity for linear Low viscosity but high shrinkage for thermosets |
| High functionality | High reactivity of functional groups Faster cure Lead to higher Tg materials | Higher hardness (scratch resistance) Higher functional groups Chemical resistance higher crosslink density | Linear - has only functionality at two ends. Linear - curing is slow. Linear - thermosets have high cross-link density leading to typically poor adhesion to interfaces. |

-continued

| Hyperbranched Material Features | Properties During Processing | Properties Post Processing | (Comparison to) Linear polymers or thermoset |
|---|---|---|---|
| High molecular weight | | Higher Tg Mechanical robustness | Tg mainly controlled by backbone |

Figure 5C:
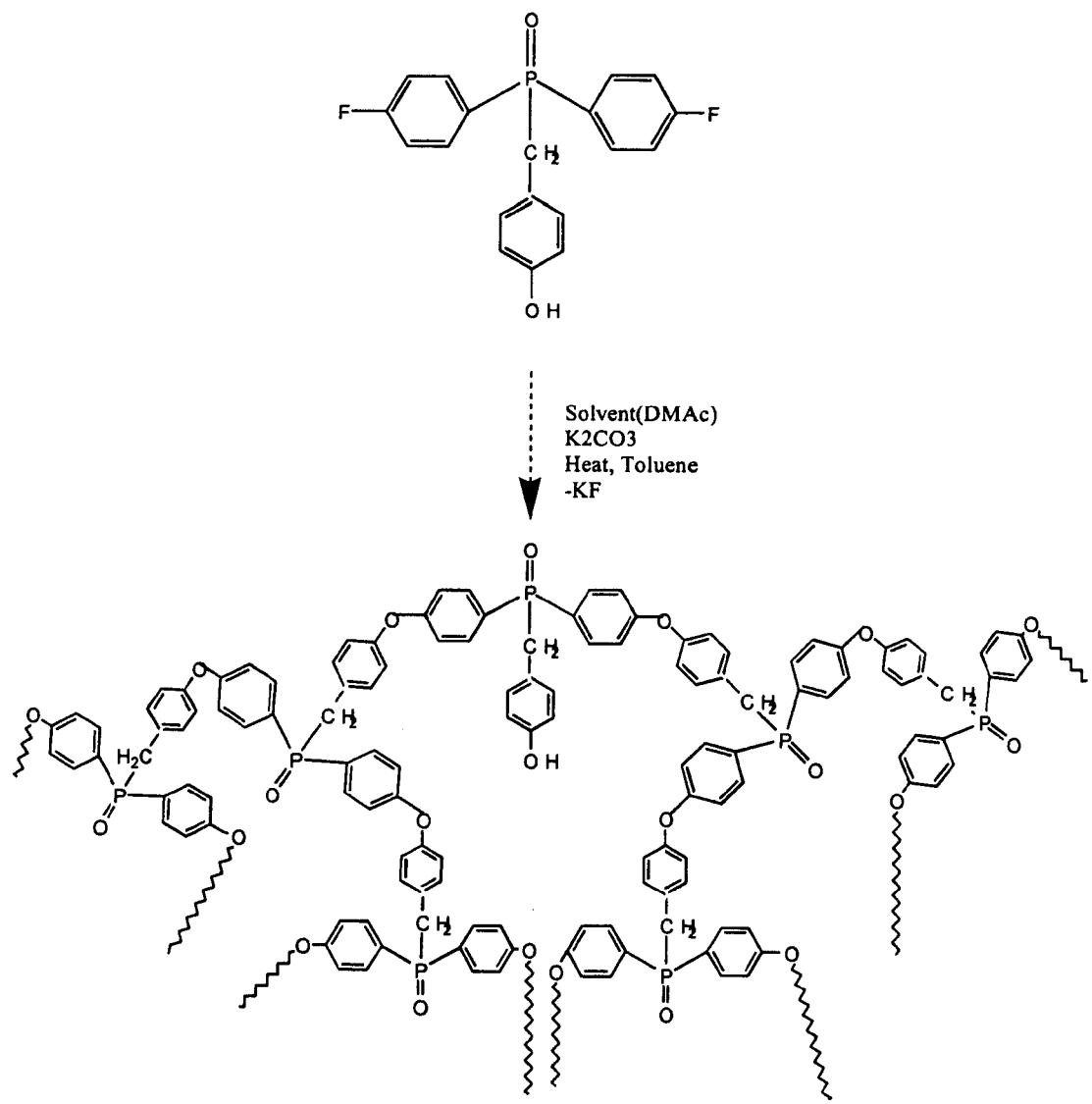
FIG. 5C illustrates an example of a phosphine oxide based hyperbranched system.
Figure 5D:
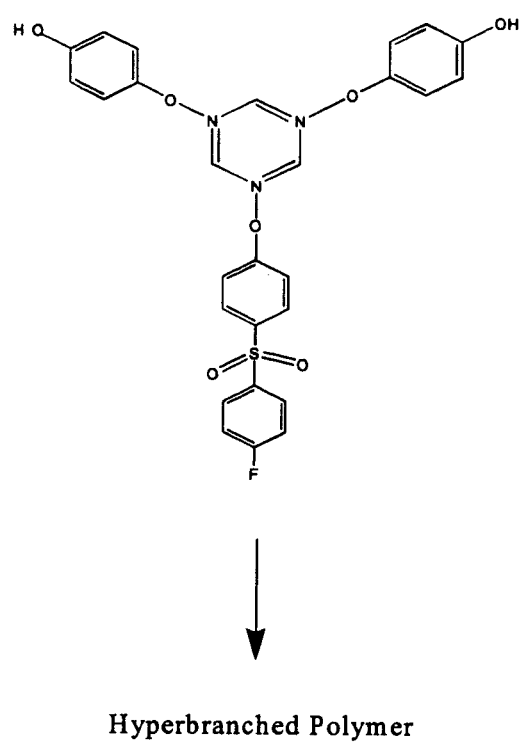
FIG. 5D illustrates a new composition of matter where a bisphenol monomer undergoes reaction using heat and base to produce a hyperbranched polymer.

Now examples of dendrimers/hyperbranched materials will be described. FIGS. 5C to 5G show examples of dendrimers/hyperbranched materials suitable for electronic packaging applications. FIGS. 5C, 5D and 5G illustrate three examples of hyperbranched polyether systems. FIG. 5C illustrates an example of a phosphine oxide based hyperbranched system. Aromatic fluorides react with phenols under basic condition via nucleophillic aromatic substitution to give the hyperbranched polymer products. The product can be used to modify polymer systems for better performance as described above in [0071].

FIG. 5D illustrates an example of a phosphine oxide based hyperbranched system. Aromatic fluorides react with phenols under basic condition via nucleophillic aromatic substitution to produce a hyperbranched polymer. Similarly, this product can be used to to modify polymer systems for better performance as described above in [0071].

Figure 5E:
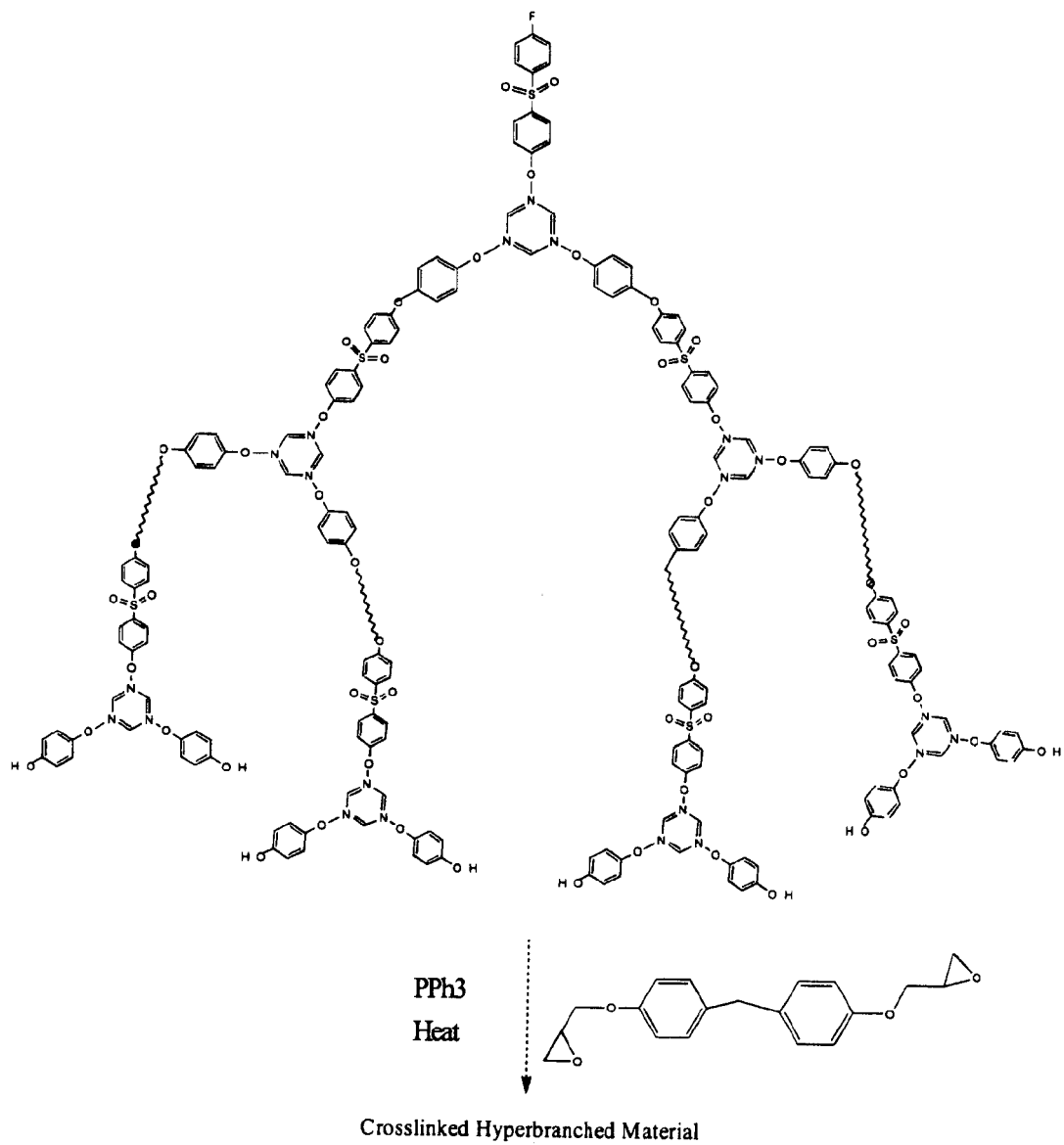
FIG. 5E illustrates an example of a cross-linkable polyether system.

FIG. 5E shows an example of polymerization of a cross-linkable polyether system with an epoxy resin. FIG. 5E shows an epoxy formulated hyperbranched material cross-linked on cure using hydroxy functional groups. Note that cross-linking is not limited to epoxy, other compounds such as cyanutares, acrylates, OCN etc. can be used. Thermal and photo cross-linking can also be easily formulated. As shown, the phenolic functional groups react with the epoxy groups via phosphine catalysis to produce the crosslinked product. This product can be used to modify polymer systems for better performance as described above in [0071].

Figure 5F:
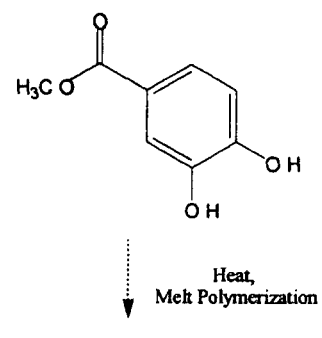
FIG. 5F illustrates an example of a hyperbranched low crystalline polymer polyether and poly(ester)
Figure 5G:
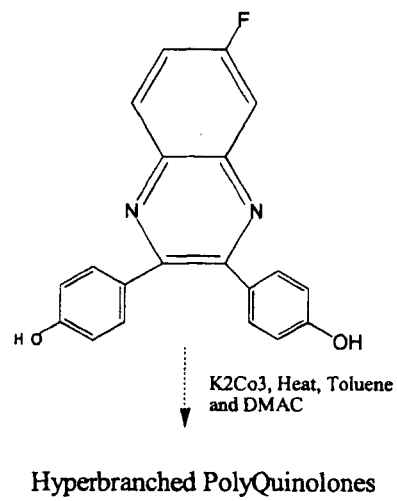
FIG. 5G shows an example of a hyperbranched polyquinoxaline.

FIG. 5F shows an example of a hyperbranched low crystalline polymer (LCP) polyether and poly(ester). As shown, the ester groups react with the phenol groups to produce the hyperbranched polymer. This product can be used to modify polymer systems for better performance as described above in [0071].

FIG. 5G shows an example of a hyperbranched polyquinoxaline which can be modified as polyethers for both cross-linked and uncross-linked material. As shown, illustrates an example of a phosphine oxide based hyperbranched system. Aromatic fluorides react with phenols under basic condition via nucleophillic aromatic substitution. The product can be used to modify polymer systems for better performance as described above in [0071].

While certain exemplary embodiments have been described and shown in the accompanying drawings, it is to be understood that such embodiments are merely illustrative and not restrictive of the current invention, and that the embodiments are not restricted to the specific constructions and arrangements shown and described since modifications may occur to those ordinarily skilled in the art.

The invention claimed is:

1. A non-conductive thermal interface material for coupling between a substrate and a chip comprising:
   a formulation resulting from a cross-linking reaction of a dendrimer or a hyperbranched polymer with a thermoset polyimide; or
   a polyimide resulting from a cross-linking reaction of bis-norbornene monomers, the cross-linking reaction involving ring opening metathesis polymerization (ROMP) and catalyzed by a transition metal, wherein each of the bis-norbornene monomers comprises a rigid aromatic moiety and two norbornene rings directly connected to the rigid aromatic moiety, the rigid aromatic moiety comprising a bisimide, wherein the two imide groups of the bisimide are attached to a same single ring.

2. The material as in claim 1 wherein the thermoset polyimide cross-links by an olefin metathesis polymerization.

3. The material of claim 1 wherein the dendrimer or the hyperbranched polymer comprises a polyphenylene and an aromatic structure, the aromatic structure selected from the group consisting of an aromatic polyamide and a polyester.

4. The material as in claim 1, wherein each of the bis-norbornene monomers has the following chemical structure:

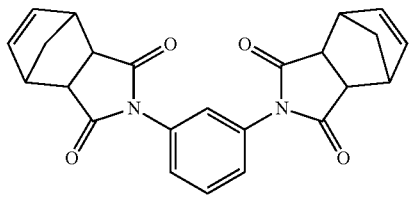

5. A non-conductive thermal interface material for coupling between a substrate and a chip comprising:
   a formulation resulting from a cross-linking reaction of a dendrimer or a hyperbranched polymer with a thermoset polyimide; or
   a polyimide resulting from a cross-linking reaction of bis-norbornene monomers, the cross-linking reaction involving ring opening metathesis polymerization (ROMP) and catalyzed by a transition metal, wherein each of the bis-norbornene monomers has a chemical structure selected from the group consisting of:

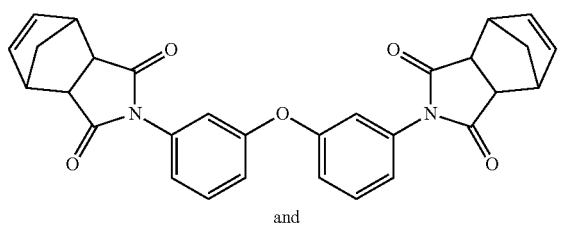

and

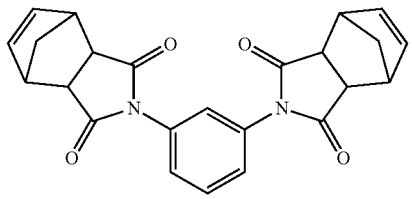

6. The material as in claim 5, wherein the thermoset polyimide cross-links by an olefin metathesis polymerization.

7. The material of claim 5, wherein the dendrimer or the hyperbranched polymer comprises a polyphenylene and an aromatic structure, the aromatic structure selected from the group consisting of an aromatic polyamide and a polyester.

* * * * *